US012787681B2

(12) United States Patent
Nakamura et al.

(10) Patent No.: US 12,787,681 B2
(45) Date of Patent: Nov. 3, 2026

(54) METHOD OF HANDLING WAFER

(71) Applicant: DISCO CORPORATION, Tokyo (JP)

(72) Inventors: Masaru Nakamura, Tokyo (JP); Kohei Tsujimoto, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 685 days.

(21) Appl. No.: 18/328,310

(22) Filed: Jun. 2, 2023

(65) Prior Publication Data

US 2023/0411180 A1 Dec. 21, 2023

(30) Foreign Application Priority Data

Jun. 15, 2022 (JP) ................................ 2022-096404

(51) Int. Cl.
*H10P 72/00* (2026.01)
*H10P 72/70* (2026.01)

(52) U.S. Cl.
CPC ...... *H10P 72/0428* (2026.01); *H10P 72/0414* (2026.01); *H10P 72/74* (2026.01); *H10P 72/7416* (2026.01)

(58) Field of Classification Search
None
See application file for complete search history.

(56) References Cited

U.S. PATENT DOCUMENTS 4,203,127 A * 5/1980 Tegge, Jr. ........... H10P 72/0442 206/460
6,088,212 A * 7/2000 Freund ................ H10P 72/1928 206/720
6,164,454 A * 12/2000 Freund .................... H10P 72/18 206/706
10,515,853 B1 * 12/2019 Chen ....................... H10P 54/00
10,658,240 B1 * 5/2020 Iriguchi .................. H10P 54/00
2010/0092718 A1 * 4/2010 Shin ........................ H10P 72/74 156/60
2011/0017391 A1 * 1/2011 Yamamoto .......... H10P 72/0442 156/379.6

(Continued)

FOREIGN PATENT DOCUMENTS

JP 10242083 A 9/1998
JP 2010183014 A 8/2010

(Continued)

OTHER PUBLICATIONS

Machine translation of JP2017228663 (Year: 2017).*

(Continued)

*Primary Examiner* — Erik T. K. Peterson
(74) *Attorney, Agent, or Firm* — Greer, Burns & Crain, Ltd

(57) ABSTRACT

A method of handling a wafer includes a frame unit forming step of forming a frame unit by placing the wafer in a central opening of an annular frame, affixing a dicing tape to a surface of the annular frame, and affixing the wafer to the dicing tape, a dividing step of processing the wafer along projected dicing lines thereon to divide the wafer into individual device chips including respective devices, a package unit forming step of forming a package unit by affixing a sheet to another surface of the annular frame and surrounding the wafer with the dicing tape and the sheet, and a delivery step of delivering the package unit.

9 Claims, 6 Drawing Sheets

(56) References Cited

U.S. PATENT DOCUMENTS

| | | | | |
|---|---|---|---|---|
| 2014/0127880 | A1* | 5/2014 | Grivna | H10P 54/00 29/25.01 |
| 2014/0127885 | A1* | 5/2014 | Grivna | H10P 72/0428 438/464 |
| 2015/0104928 | A1* | 4/2015 | Kozai | H10P 54/00 438/460 |
| 2015/0357242 | A1* | 12/2015 | Nakamura | H10P 54/00 438/462 |
| 2016/0035787 | A1 | 2/2016 | Matsuda | |
| 2017/0154768 | A1* | 6/2017 | Zhao | H10P 70/30 |
| 2020/0266102 | A1* | 8/2020 | Harada | H10P 54/00 |
| 2020/0388536 | A1* | 12/2020 | Harada | B23K 26/0006 |
| 2021/0066111 | A1 | 3/2021 | Zhao | |

FOREIGN PATENT DOCUMENTS

| | | | |
|---|---|---|---|
| JP | 2016032049 | A | 3/2016 |
| JP | 2017228663 | A | 12/2017 |
| JP | 2020021791 | A | 2/2020 |
| JP | 2021034704 | A | 3/2021 |

OTHER PUBLICATIONS

Office Action issued by the Japanese Patent Office in corresponding JP Patent Application Publication No. 2022-096404, dated Jan. 20, 2026.

* cited by examiner

METHOD OF HANDLING WAFER

BACKGROUND OF THE INVENTION

Field of the Invention

The present invention relates to a method of handling a wafer having a plurality of devices formed in respective areas demarcated on a face side thereof by a grid of intersecting projected dicing lines.

Description of the Related Art

Wafers with a plurality of devices such as integrated circuits (ICs), large scale integrations (LSIs) formed in respective areas demarcated on a face side thereof by a grid of intersecting projected dicing lines are divided into individual device chips by a dicing apparatus, a laser processing apparatus, or the like. The device chips divided from the wafers will be used in electronic appliances such as cellular phones and personal computers.

Since the wafers as separated into the individual device chips are delivered to a bonding process in which the device chips are picked up and bonded to wiring boards, each of the wafers still remains as a unitary structure by a dicing tape mounted on an annular frame while the wafer is disposed in a central opening of the annular frame (see, for example, JP-H10-242083A).

According to a technology referred to as Dicing Before Grinding in which grooves are formed in a wafer along projected dicing lines on a face side of the wafer to a depth corresponding to a finished wafer thickness (see, for example, JP-2010-183014A), and then a reverse side of the wafer is ground to divide the wafer into individual device chips, the wafer as separated into the individual device chips is also kept unitary by a dicing tape mounted on an annular frame while the wafer is disposed in a central opening of the annular frame.

There is known a technology in which a laser beam is applied to a wafer while keeping its focused spot within the wafer along projected dicing lines on a face side of the wafer, forming modified layers in the wafer, and then a reverse side of the wafer is ground to divide the wafer into individual device chips (see, for example, JP-2020-021791A). According to the technology, the individual device chips divided from the wafer also remain kept together by a dicing tape mounted on an annular frame while the device chips are disposed in a central opening of the annular frame.

SUMMARY OF THE INVENTION

However, after wafers have been divided into individual device chips by any of the above various dividing processes, they may not necessarily be immediately processed by a next process such as a bonding process, but may possibly be left unprocessed for a long period of time. During the period of time in which the wafers remain unprocessed, contaminants such as powdery dust particles are likely to be deposited on the surfaces of the device chips, tending to lower the quality of the device chips.

The above problem becomes particularly serious if a factory where a dividing process is carried out to divide wafers into individual device chips and a factory where device chips are picked up and bonded to wiring boards are spaced from each other by a large distance, and when wafers processed by a dividing process are to be kept in storage for a long period of time.

It is therefore an object of the present invention to provide a method of handling a wafer so as to solve the problem of contaminants such as powdery dust particles deposited on the surfaces of individual device chips divided from the wafer, tending to lower the quality of the device chips, when the wafer as divided into the device chips is delivered to a next process.

In accordance with an aspect of the present invention, there is provided a method of handling a wafer having a plurality of devices formed in respective areas demarcated on a face side thereof by a grid of intersecting projected dicing lines, including a frame unit forming step of forming a frame unit by placing the wafer in a central opening of an annular frame, affixing a dicing tape to a surface of the annular frame, and affixing the wafer to the dicing tape, a dividing step of processing the wafer along the projected dicing lines to divide the wafer into individual device chips including the respective devices, a package unit forming step of forming a package unit by affixing a sheet to another surface of the annular frame and surrounding the wafer with the dicing tape and the sheet, and a delivery step of delivering the package unit.

Preferably, the method further includes an inactive gas filling step of filling a space in the package unit with an inactive gas. Preferably, the inactive gas filling step includes the step of filling the space in the package unit with the inactive gas by carrying out the package unit forming step in an inactive gas environment. Preferably, the inactive gas filling step includes the step of filling the space in the package unit with liquid nitrogen and expanding the liquid nitrogen in the package unit forming step. Preferably, the method further includes a cleaning step of cleaning the wafer before the package unit forming step.

Preferably, the sheet is a thermal-pressure-bonding sheet, and the thermal-pressure-bonding sheet is affixed to the other surface of the annular frame by heat and pressure in the package unit forming step. Preferably, the thermal-pressure-bonding sheet is a polyolefin-based sheet selected from the group consisting of a polyethylene sheet, a polypropylene sheet, and a polystyrene sheet. Preferably, a temperature to which the thermal-pressure-bonding sheet is heated to affix itself to the other surface of the annular frame is in a range from 120° C. to 140° C. if the thermal-pressure-bonding sheet is the polyethylene sheet, from 160° C. to 180° C. if the thermal-pressure-bonding sheet is the polypropylene sheet, and from 220° C. to 240° C. if the thermal-pressure-bonding sheet is the polystyrene sheet.

With the method of handling a wafer according to the present invention, even when a subsequent step is not immediately performed on the wafer after the wafer has been divided into the individual device chips, since the face side of the wafer is protected by the sheet, the problem of a reduced quality of the device chips due to powdery dust particles or the like which would otherwise be deposited on the face sides of the device chips is solved. If the package unit is filled with the inactive gas, metal parts of the devices on the wafer are prevented from being oxidized, keeping the device chips in good quality after the wafer has been divided into the device chips.

The above and other objects, features and advantages of the present invention and the manner of realizing them will become more apparent, and the invention itself will best be understood from a study of the following description and appended claims with reference to the attached drawings showing some preferred embodiments of the invention.

DETAILED DESCRIPTION OF THE PREFERRED EMBODIMENTS

Methods of handling a wafer according to preferred embodiments of the present invention will be described below with reference to the accompanying drawings.

Figure 1:
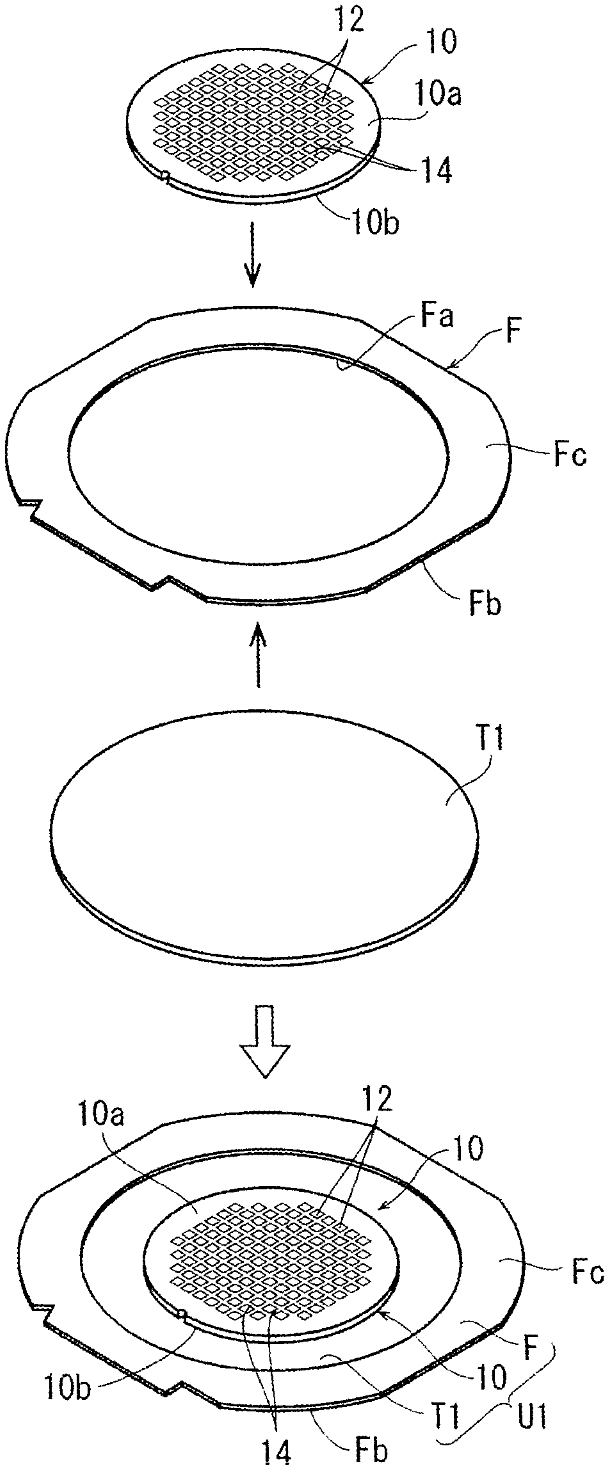
FIG. 1 is a perspective view illustrating a manner in which a frame unit forming step of a method of handling a wafer according to an embodiment of the present invention is carried out.

FIG. 1 illustrates in perspective an unprocessed wafer 10 to be handled by a method of handling a wafer according to an embodiment of the present invention. As illustrated in FIG. 1, the wafer 10 includes a circular substrate of silicon (Si), for example, and has a plurality of devices 12 formed in respective areas demarcated on a face side 10*a* thereof by a grid of projected dicing lines 14.

After the wafer 10 illustrated in FIG. 1 has been prepared, the wafer 10 is placed in a circular central opening Fa of an annular frame F. An outer circumferential edge portion of a circular dicing tape T1 is affixed to a surface Fb, i.e., a lower surface in FIG. 1, of the annular frame F. A reverse side 10*b* of the wafer 10 is affixed to a central portion of the dicing tape T1. The wafer 10, the annular frame F, and the dicing tape T1 thus affixed together make up a frame unit U1 (see a lower section of FIG. 1) (frame unit forming step). According to the present embodiment, the dicing tape T1 is an adhesive tape including a glue layer on its upper surface. According to the present invention, however, the dicing tape T1 may be a thermal-pressure-bonding sheet free of a glue layer on its upper surface and may be affixed to the annular frame F and the wafer 10 by heat and pressure.

Then, a dividing step is carried out to process the wafer 10 along the projected dicing lines 14 to divide the wafer 10 along the projected dicing lines 14 into individual device chips. The dividing step is carried out by a cutting apparatus 20 partly depicted in FIG. 2, for example.

Figure 2:
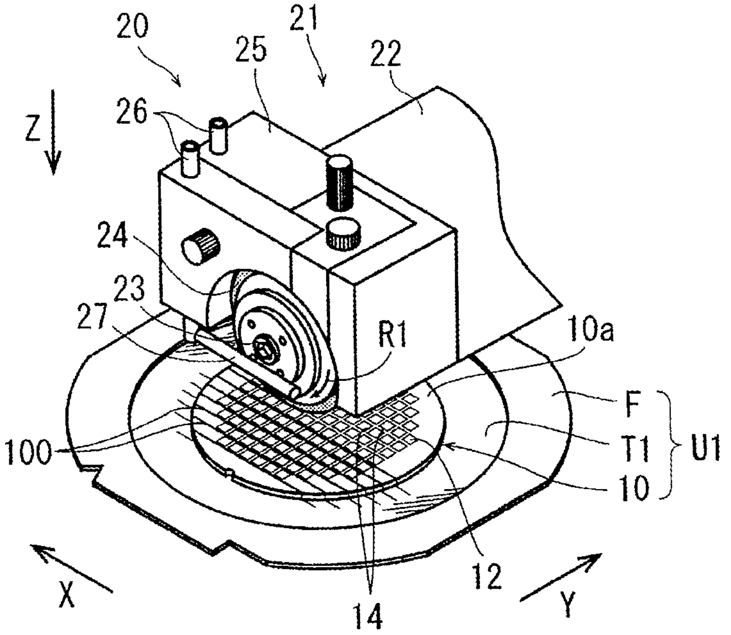
FIG. 2 is a perspective view illustrating a manner in which a dividing step of the method is carried out.

As illustrated in FIG. 2, the cutting apparatus 20 includes a chuck table, not depicted, for holding the frame unit U1 under suction thereon and a cutting unit 21 for cutting the wafer 10 of the frame unit U1 held under suction on the chuck table. The chuck table is rotatable about a vertical central axis thereof and is also movable in an X-axis direction indicated by an arrow X by an X-axis feed mechanism, not depicted. The cutting unit 21 includes a spindle housing 22 extending in a Y-axis direction indicated by an arrow Y that is perpendicular to the X-axis direction, a spindle 23 rotatably housed in the spindle housing 22, and an annular cutting blade 24 mounted on a distal end of the spindle 23. The cutting apparatus 20 also includes a Y-axis feed mechanism, not depicted, for moving, i.e., indexing-feeding, the cutting blade 24 in the Y-axis direction. The spindle 23 is rotatable about a horizontal central axis thereof by a spindle motor, not depicted, coupled to the spindle 23. A distal end portion of the spindle housing 22 is covered with a blade cover 25. The blade cover 25 has a pair of cutting water inlet ports 26 for introducing cutting water into the blade cover 25 and a cutting water ejection nozzle 27 for ejecting the cutting water introduced from the cutting water inlet ports 26 to a region of the wafer 10 that is cut by the cutting blade 24.

For carrying out the dividing step, the wafer 10 with the face side 10*a* facing upwardly is placed on the chuck table of the cutting apparatus 20 and held under suction thereon. Then, using an alignment unit, not depicted, those projected dicing lines 14 of the wafer 10 that extend in a first direction are aligned with the X-axis direction, and one of those projected dicing lines 14 is positioned in vertical alignment with the cutting blade 24. Then, the cutting blade 24 is rotated about its central axis at a high speed in a direction indicated by an arrow R1 and lowered in a Z-axis direction indicated by an arrow Z that is perpendicular to the X-axis direction and the Y-axis direction, cutting into the wafer 10 from its face side 10*a* on the projected dicing line 14 aligned with the cutting blade 24. At the same time, the chuck table is moved, i.e., processing-fed, along the projected dicing line 14 in the X-axis direction by the X-axis feed mechanism, thereby cutting a dividing groove 100 in the wafer 10 along which the wafer 10 is to be divided.

Then, the cutting blade 24 is indexing-fed in the Y-axis direction by the Y-axis feed mechanism until the cutting blade 24 is aligned with an unprocessed projected dicing line 14 next in the Y-axis direction to the projected dicing line 14 along which the dividing groove 100 has been formed in the wafer 10. Thereafter, the cutting blade 24 is rotated and lowered to cut another dividing groove 100 in the wafer 10 along the next projected dicing line 14. The above cutting process is repeated until dividing grooves 100 are formed in the wafer 10 along all the projected dicing lines 14 of the wafer 10 that extend in the first direction. Then, the chuck table is turned 90 degrees about its vertical central axis until those projected dicing lines 14 that extend in the second direction perpendicular to the first direction are aligned with the X-axis direction. Thereafter, the cutting blade 24 is rotated and lowered to cut a dividing groove 100 in the wafer 10 along one of the projected dicing lines 14 extending in the second direction. The cutting process is repeated until dividing grooves 100 are formed in the wafer 10 along all the projected dicing lines 14 of the wafer 10 that extend in the second direction, i.e., that has newly been aligned with the X-axis direction. In this manner, the dividing grooves 100 are formed in the wafer 10 along all the projected dicing lines 14 extending in the first and second directions. In the dividing step thus carried out, the wafer 10 is divided into individual device chips that include the respective devices 12.

Figure 3:
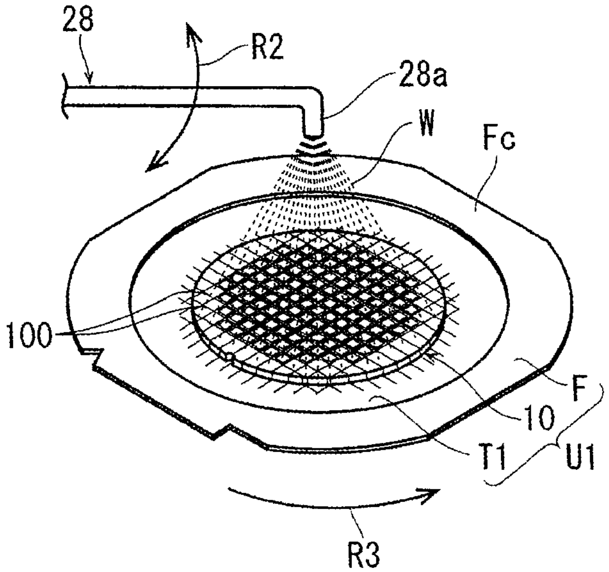
FIG. 3 is a perspective view illustrating a manner in which a cleaning step of the method is carried out.

According to the present embodiment, the above dividing step is followed by a cleaning step illustrated in FIG. 3. For carrying out the cleaning step, the frame unit U1 from the dividing step is delivered to a cleaning apparatus, not depicted, included in the cutting apparatus 20. The cleaning apparatus includes a spinner table, not depicted, rotatable at a high speed. The frame unit U1 is held under suction on the spinner table, and a cleaning water supply nozzle 28 illustrated in FIG. 3 is positioned above the wafer 10 and swung in horizontal directions indicated by an arrow R2. While the frame unit U1 on the spinner table is rotated at a high speed in a direction indicated by an arrow R3, the swinging cleaning water supply nozzle 28 ejects cleaning water W from a nozzle tip end 28*a* thereof onto the wafer 10. The cleaning water W applied to the face side 10*a* of the wafer 10 cleans away powdery dust particles including swarf that has been deposited on the face side 10*a* of the wafer 10 in the dividing step, thereby cleaning the face side 10*a* of the wafer 10. After the cleaning step has been carried out, the frame unit U1 is dried in a drying step, as needed.

After the drying step has been carried out, a package unit forming step is carried out as illustrated in FIGS. 4A through 4D.

In the package unit forming step, the frame unit U1 from the drying step is placed on a holding table, not depicted, that is rotatable about its vertical central axis. As illustrated in FIG. 4A, a sheet T2 having dimensions large enough to cover the frame unit U1 in its entirety is prepared. Then, the sheet T2 is placed on and affixed to another surface Fc, i.e., an upper surface in FIG. 4A, of the annular frame F. At this time, an inactive gas filling step is carried out to fill the inner space between the sheet T2 and the upper surface of the frame unit U1 with an inactive gas, e.g., nitrogen ($N_2$).

The inactive gas filling step may be performed in an inactive gas atmosphere created by introducing an inactive gas into a working space S defined as a hermetically sealed space by a case, not depicted, or in a liquid nitrogen environment by positioning a liquid nitrogen supply unit 30 (see FIG. 4A) over the upper surface of the frame unit U1 and dropping a predetermined amount of liquid nitrogen 34 onto the frame unit U1 from a liquid nitrogen supply nozzle 32 on a distal end of the liquid nitrogen supply unit 30 immediately before the sheet T2 is affixed to the other surface Fc of the annular frame F. According to the latter alternative, after the liquid nitrogen 34 has been dropped onto the frame unit U1, the liquid nitrogen supply unit 30 is quickly moved to a position where it will not obstruct the affixing of the sheet T2 to the annular frame F and then the sheet T2 is placed on the frame unit U1. The inactive gas described above is not limited to nitrogen ($N_2$), but may be appropriately selected from any of known inactive gases for industrial use such as argon, helium, or carbon dioxide.

The sheet T2 may be a thermal-pressure-bonding sheet that can be affixed to the annular frame F by heat and pressure, for example. The thermal-pressure-bonding sheet may be a polyolefin-based sheet, for example. The polyolefin-based sheet may be either a polyethylene sheet, a polypropylene sheet, or a polystyrene sheet. As described above, after the sheet T2 has been placed on the other surface Fc of the annular frame F of the frame unit U1, a thermal-pressure-bonding unit 40 illustrated in FIG. 4B is prepared. The thermal-pressure-bonding unit 40 has a heating roller 42 that incorporates a heater and a temperature sensor disposed therein, both of which are not illustrated. For affixing the sheet T2 to the annular frame F, the heater is energized to increase the temperature of a surface 42*a* of the heating roller 42 to a predetermined temperature at which the sheet T2 exhibits adhesive power, and the heating roller 42 is pressed down against the sheet T2 on the other surface Fc of the annular frame F. Then, the heating roller 42 is rotated in a direction indicated by an arrow R4 and the holding table that holds the frame unit U1 thereon is rotated about its central axis in a direction indicated by an arrow R5. In this manner, the sheet T2 is affixed to the other surface Fc of the annular frame F fully circumferentially therealong.

The temperature to which the thermal-pressure-bonding sheet used as the sheet T2 described above is heated by the heating roller 42 to affix itself to the other surface Fc of the annular frame F is in a range from 120° C. to 140° C. if the thermal-pressure-bonding sheet is a polyethylene sheet, from 160° C. to 180° C. if the thermal-pressure-bonding sheet is a polypropylene sheet, and from 220° C. to 240° C. if the thermal-pressure-bonding sheet is a polystyrene sheet. By thus heating the sheet T2 to one of the above temperature ranges, the thermal-pressure-bonding sheet is softened to exhibit adhesive power, affixing the sheet T2 to the other surface Fc of the annular frame F even in the absence of a glue layer on the surface of the thermal-pressure-bonding sheet to be affixed to the other surface Fc of the annular frame F. The surface 42*a* of the heating roller 42 is coated with a fluororesin layer to prevent the heating roller 42 from sticking to and winding up the thermal-pressure-bonding sheet due to the adhesive power exhibited by the thermal-pressure-bonding sheet.

Figure 4C:
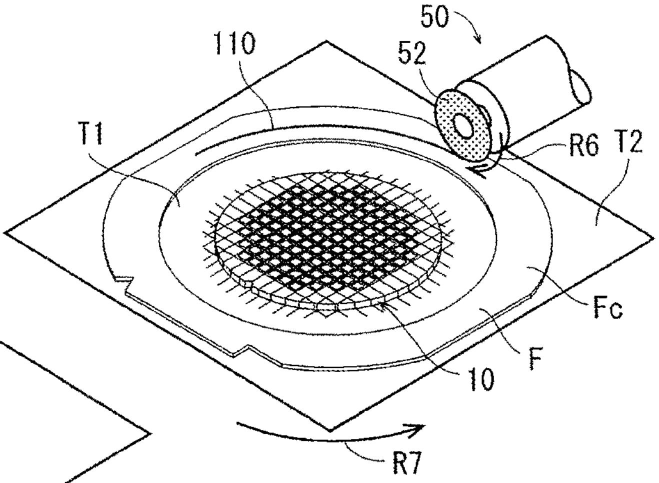
FIGS. 4A through 4D are perspective views illustrating a manner in which a package unit forming step and an inactive gas filling step of the method are carried out.
Figure 4A:
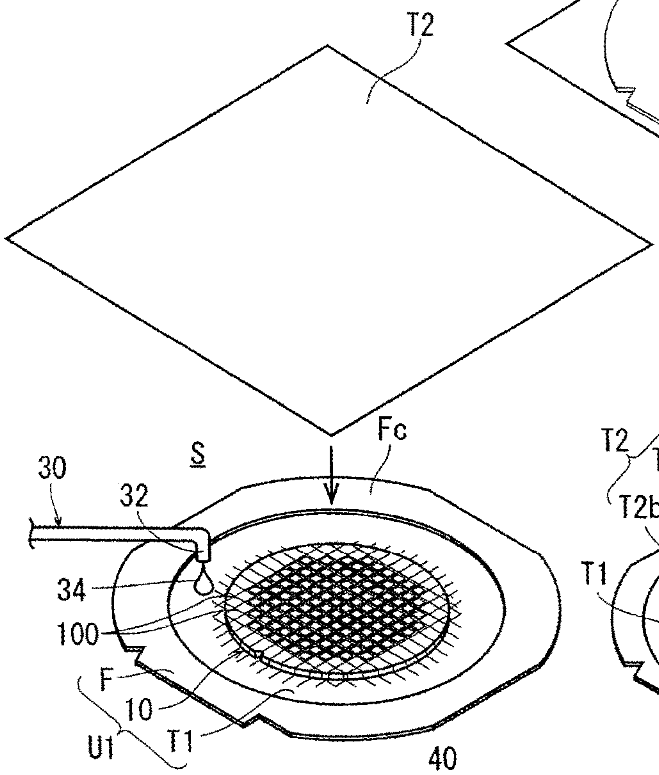

As described above, after the sheet T2 has been affixed to the other surface Fc of the annular frame F fully circumferentially therealong, cutting means 50 illustrated in FIG. 4C is prepared, and a rotatable cutting blade 52 of the cutting means 50 is positioned above the other surface Fc of the annular frame F. Then, the cutting blade 52 is rotated about its central axis in a direction indicated by an arrow R6, and the annular frame F is rotated about its central axis in a direction indicated by an arrow R7, thereby forming a circular cut groove 110 in the sheet T2 along the annular frame F.

Figure 4D:
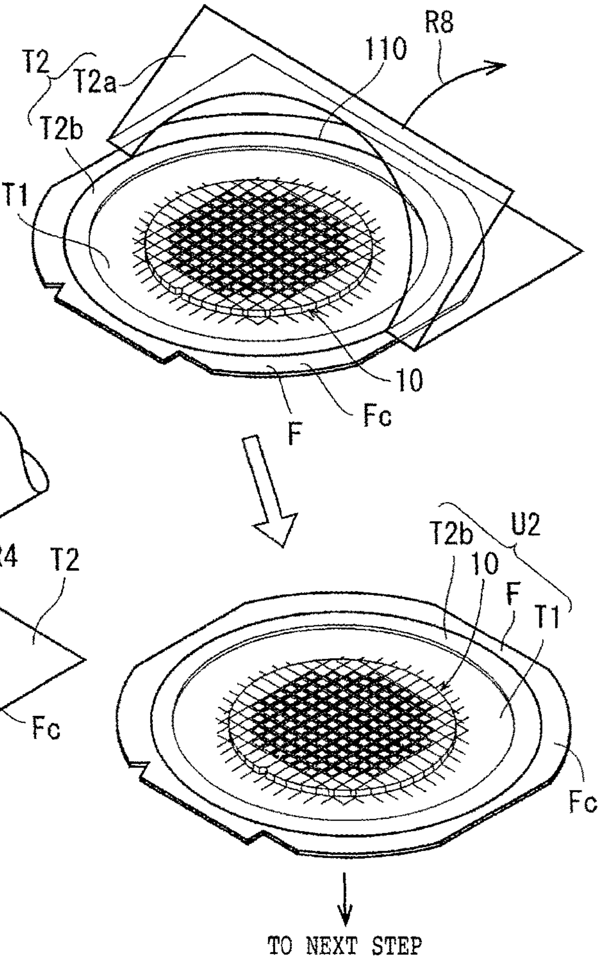
Figure 4B:
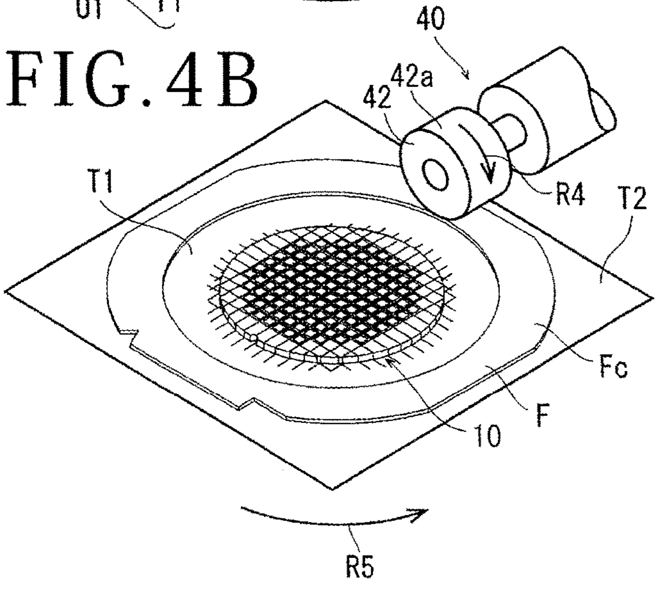

The cut groove 110 formed in the sheet T2 separates the sheet T2 into an inner sheet portion T2*b* inside of the cut groove 110 and an outer sheet portion T2*a* outside of the cut groove 110, as illustrated in an upper section of FIG. 4D. The outer sheet portion T2*a* is peeled off from the annular frame F and removed, leaving the inner sheet portion T2*b* on the annular frame F. As illustrated in a lower section of FIG. 4D, the inner sheet portion T2*b* remains affixed to the other surface Fc of the annular frame F, producing a package unit U2 in which the wafer 10 is surrounded by the dicing tape T1 and the inner sheet portion T2*b*. The package unit forming step is now completed. If the inactive gas has filled the space in the package unit U2, then the inactive gas prevents metal parts such as bonding pads, etc., of the devices 12 of the wafer 10 from being oxidized. If the liquid nitrogen 34 has filled the space in the package unit U2, then since the liquid nitrogen 34 is vaporized and expanded when the sheet T2 is bonded to the annular frame F by heat and pressure, air in the package unit U2 is expelled out of the package unit U2, and the sheet T2 is prevented from being attached to the face side 10a of the wafer 10.

When the package unit forming step has been completed, a delivery step is carried out to deliver the package unit U2 to a next step. In the delivery step, the package unit U2 may be delivered to a distant factory where a pickup step and a bonding step are carried out or may be stored in a predetermined storage location in the factory before a pickup step and a bonding step are carried out.

With the method of handling a wafer according to the present embodiment, even when a subsequent step is not immediately performed on the wafer 10 after the wafer 10 has been divided into the individual device chips, since the face side 10a of the wafer 10 is protected by the sheet T2b, the problem of a reduced quality of the device chips due to powdery dust particles or the like which would otherwise be deposited on the face sides of the device chips is solved. Also, according to the above embodiment, if the package unit U2 is filled with the inactive gas, the metal parts of the devices 12 of the wafer 10 are prevented from being oxidized, keeping the device chips in good quality after the wafer 10 has been divided into the device chips.

The dividing step according to the embodiment described above is carried out with use of only the cutting apparatus 20 illustrated in FIG. 2. According to the present invention, however, the wafer 10 may be processed and divided along the projected dicing lines 14 into individual device chips by a dividing step of a method of handling a wafer according to another embodiment of the present invention. The dividing step of the method of handling a wafer according to the other embodiment will be described below.

Figure 5A:
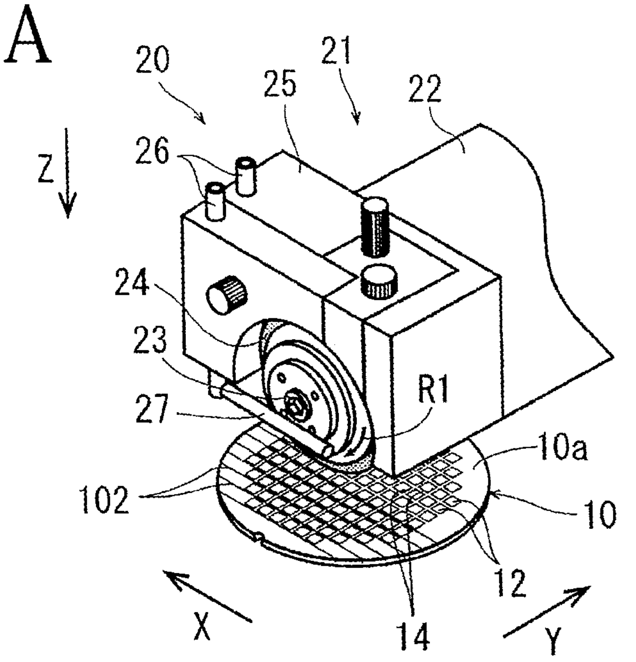
FIG. 5A is a perspective view illustrating a manner in which cut grooves are formed in a dividing step of a method of handling a wafer according to another embodiment of the present invention.
Figure 5B:
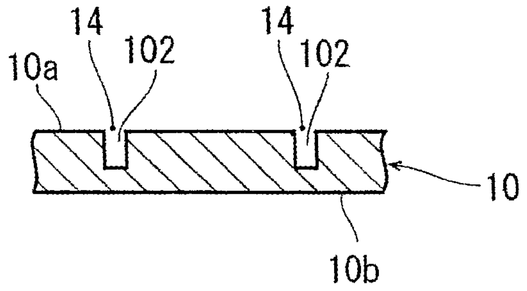
FIG. 5B is an enlarged fragmentary cross-sectional view of the wafer with cut grooves formed therein.
Figure 5C:
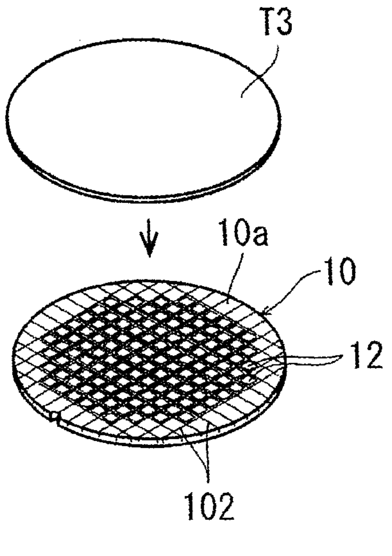
FIG. 5C is a perspective view illustrating a manner in which a protective tape is affixed to the wafer with the cut grooves formed therein.

FIG. 5A illustrates in perspective the cutting apparatus 20 that has been described above with reference to FIG. 2. Since the cutting apparatus 20 illustrated in FIG. 5A is similar in structure to the cutting apparatus 20 illustrated in FIG. 2, the structural details of the cutting apparatus 20 will not be described in detail below. The cutting apparatus 20 illustrated in FIG. 5A operates as follows:

After an unprocessed wafer 10 illustrated in FIG. 1 has been prepared, the wafer 10 with the face side 10a facing upwardly is placed on the chuck table, not depicted, of the cutting apparatus 20 and held under suction on the chuck table. Then, using the alignment unit, not depicted, those projected dicing lines 14 of the wafer 10 that extend in the first direction are aligned with the X-axis direction, and one of those projected dicing lines 14 is positioned in vertical alignment with the cutting blade 24. Then, the cutting blade 24 is rotated about its central axis at a high speed in the direction indicated by the arrow R1 and lowered in the Z-axis direction, cutting into the wafer 10 from its face side 10a on the projected dicing line 14 aligned with the cutting blade 24. At the same time, the chuck table is moved, i.e., processing-fed, along the projected dicing line 14 in the X-axis direction by the X-axis feed mechanism, thereby cutting a cut groove 102 in the wafer 10 to a depth corresponding to a finished thickness of the wafer 10, as illustrated in FIG. 5B. Then, the cutting blade 24 is indexing-fed in the Y-axis direction by the Y-axis feed mechanism until the cutting blade 24 is aligned with an unprocessed projected dicing line 14 next in the Y-axis direction to the projected dicing line 14 along which the cut groove 102 has been formed in the wafer 10. Thereafter, the cutting blade 24 is rotated and lowered to cut another cut groove 102 in the wafer 10 along the next projected dicing line 14. The above cutting process is repeated until cut grooves 102 are formed in the wafer 10 along all the projected dicing lines 14 of the wafer 10 that extend in the first direction. Then, the chuck table is turned 90 degrees about its vertical central axis until those projected dicing lines 14 that extend in the second direction perpendicular to the first direction are aligned with the X-axis direction. Thereafter, the cutting blade 24 is rotated and lowered to cut a cut groove 102 in the wafer 10 along one of the projected dicing lines 14 extending in the second direction. The cutting process is repeated until cut grooves 102 are formed in the wafer 10 along all the projected dicing lines 14 of the wafer 10 that extend in the second direction, i.e., that has newly been aligned with the X-axis direction. In this manner, the cut grooves 102 are formed in the wafer 10 along all the projected dicing lines 14 extending in the first and second directions, as illustrated in FIG. 5C. After the cut grooves 102 have been formed in the wafer 10 along all the projected dicing lines 14 on the face side 10a of the wafer 10, as illustrated in FIG. 5C, a protective tape T3 is affixed to the face side 10a of the wafer 10 in which the cut grooves 102 have been formed.

Figure 6A:
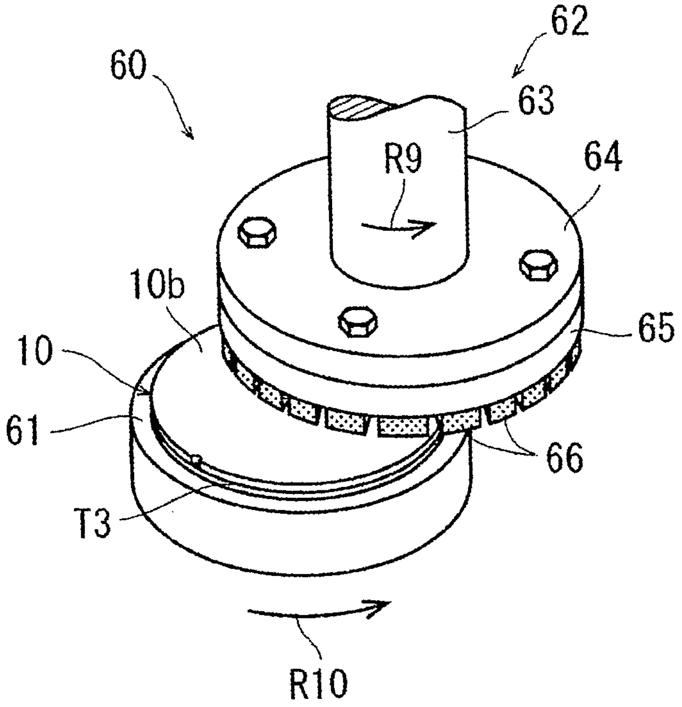
FIG. 6A is a perspective view illustrating a manner in which a reverse side of the wafer is ground.

The wafer 10 with the cut grooves 102 formed therein and the protective tape T3 affixed thereto is then delivered to a grinding apparatus 60 illustrated in FIG. 6A. The grinding apparatus 60 is partly depicted in FIG. 6A. As illustrated in FIG. 6A, the grinding apparatus 60 includes a chuck table 61 for holding the wafer 10 thereon and a grinding unit 62. The chuck table 61 is rotatable about its vertical central axis by a rotating mechanism. The grinding unit 62 includes a spindle 63 rotatable by a rotating mechanism, not depicted, a wheel mount 64 mounted on a lower end of the spindle 63, and a grinding wheel 65 attached to a lower surface of the wheel mount 64. An annular array of grindstones 66 are disposed on the lower surface of a grinding wheel 65.

When the wafer 10 is delivered to the grinding apparatus 60, the wafer 10 is held under suction on the chuck table 61 such that the face side 10a of the wafer 10 to which the protective tape T3 is affixed faces downwardly and the reverse side 10b of the wafer 10 faces upwardly. Then, the spindle 63 of the grinding unit 62 is rotated at 6000 rpm, for example, about its central axis in a direction indicated by an arrow R9 in FIG. 6A, and at the same time the chuck table 61 is rotated at 300 rpm, for example, about its central axis in a direction indicated by an arrow R10 in FIG. 6A. While a grinding water supply unit not depicted is supplying grinding water to the reverse side 10b of the wafer 10, the grindstones 66 are brought into abrasive contact with the reverse side 10b of the wafer 10 and grinding-fed downwardly at a grinding-feed speed of 1 μm/second, for example, thereby grinding the wafer 10. At this time, the wafer 10 can be ground while the thickness of the wafer 10 is being measured by a contact-type thickness measuring gage, not depicted. The grindstones 66 grind the reverse side 10b of the wafer 10 until the wafer 10 is thinned down to a predetermined finished thickness. When the wafer 10 is ground to the finished thickness, the cut grooves 102 that have previously been cut in the face side 10a of the wafer 10 become exposed on the reverse side 10b, thereby dividing the wafer 10 into individual device chips including the respective devices 12. The dividing step thus completed is followed by a cleaning step and a drying step, for example, not depicted, if necessary.

Figure 6B:
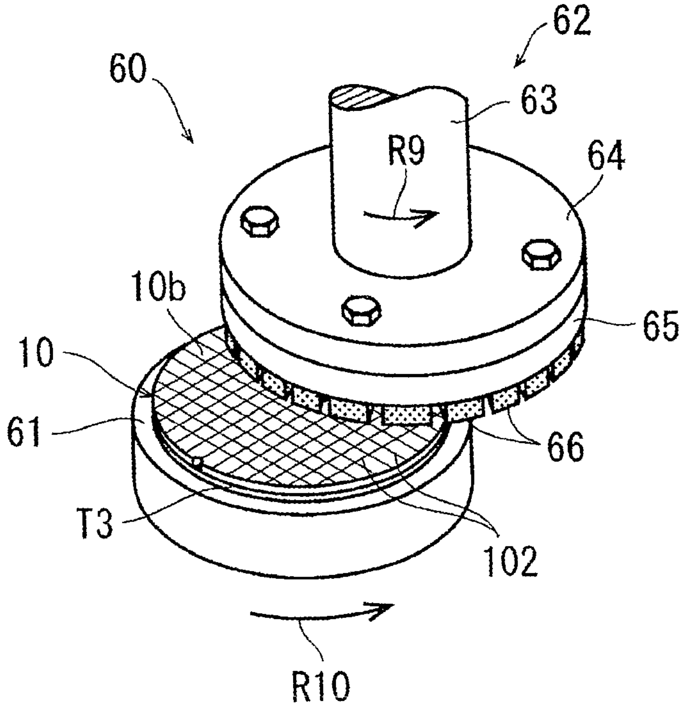
FIG. 6B is a perspective view illustrating a manner in which the wafer is divided along the cut grooves by grinding the reverse side of the wafer.

After the dividing step in which the cut grooves 102 are formed in the wafer 10 along the projected dicing lines 14 with use of the cutting apparatus 20 illustrated in FIG. 5A and the wafer 10 is divided into individual device chips with use of the grinding apparatus 60 illustrated in FIGS. 6A and 6B, the frame unit forming step described above with reference to FIG. 1 is performed on the wafer 10 with the protective tape T3 affixed to the face side 10a thereof, producing a frame unit U1, and then the protective tape T3 is peeled off from the face side 10*a* of the wafer 10. The frame unit U1 is now brought into a state where the cleaning step described above with reference to FIG. 3 has been completed on the wafer 10. According to the other embodiment described above, the order in which the dividing step and the frame unit forming step are performed is reverse to the order in which the frame unit forming step and the dividing step are performed according to the previous embodiment. However, the present invention covers both of the orders of the steps according to the above embodiments.

After the dividing step has been carried out as described above with reference to FIGS. 5A through 6B and then the frame unit forming step has been carried out, the package unit forming step and the delivery step are carried out as described above with reference to FIG. 4. The embodiment described above with reference to FIGS. 5A through 6B offers the same advantages as the preceding embodiment.

The present invention is not limited to the embodiments described above, but covers still another embodiment to be described below with reference to FIGS. 7, 8A, and 8B.

Figure 7:
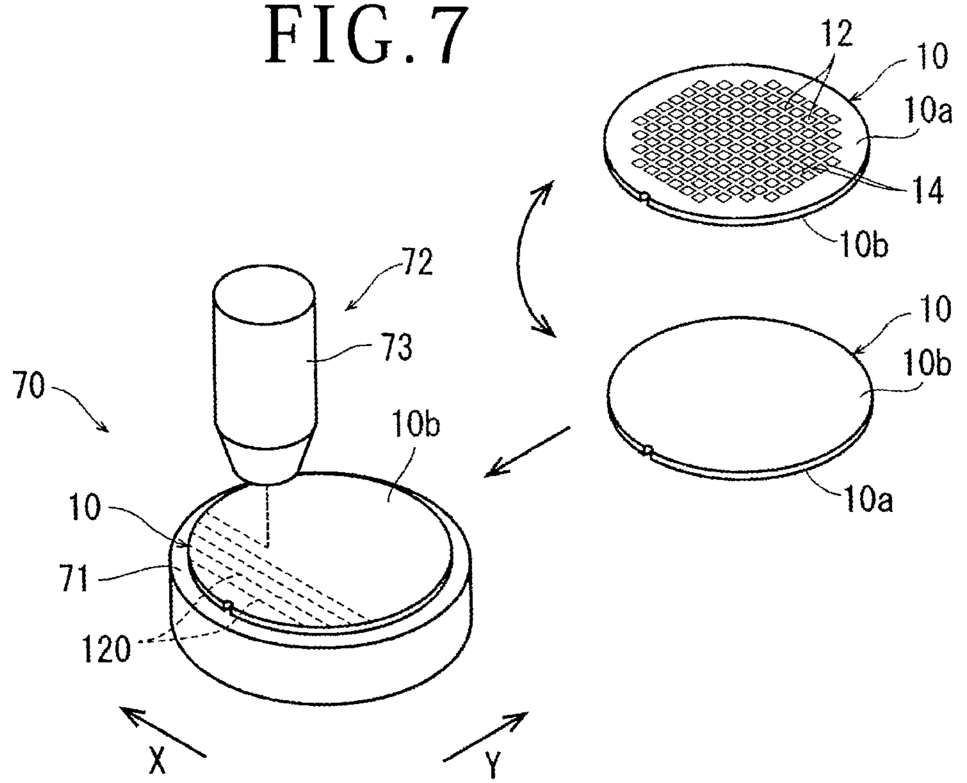
FIG. 7 is a perspective view illustrating a manner in which modified layers are formed in a wafer along projected dicing lines established thereon in a dividing step of a method of handling a wafer according to still another embodiment of the present invention.
Figure 8A:
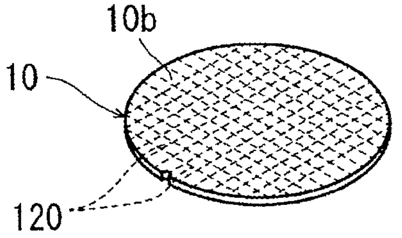
FIG. 8A is a perspective view illustrating a reverse side of the wafer with the modified layers formed therein along the projected dicing lines.
Figure 8B:
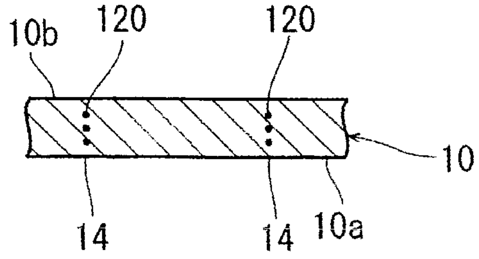
FIG. 8B is an enlarged fragmentary cross-sectional view of the wafer with the modified layers formed therein.

After an unprocessed wafer 10 illustrated in FIG. 1 has been prepared, the wafer 10 is delivered to a laser processing apparatus 70 illustrated in FIG. 7. The laser processing apparatus 70 is partly depicted in FIG. 7. As illustrated in FIG. 7, the laser processing apparatus 70 includes a chuck table 71 for holding the wafer 10 thereon and a laser beam applying unit 72 for applying a laser beam LB to the wafer 10 held on the chuck table 71. The laser beam applying unit 72 includes a laser oscillator, not depicted, and a beam condenser 73 and acts as means for applying the laser beam LB whose wavelength is transmittable through the wafer 10 from the beam condenser 73 to the wafer 10. The chuck table 71 includes an X-axis feed mechanism, not depicted, for processing-feeding the chuck table 71 and the beam condenser 73 relatively to each other in an X-axis direction, a Y-axis feed mechanism, not depicted, for indexing-feeding the chuck table 71 and the beam condenser 73 relatively to each other in an Y-axis direction perpendicular to the X-axis direction, and a rotating mechanism, not depicted, for rotating the chuck table 71 about its central vertical axis perpendicular to the X-axis and Y-axis directions.

When the wafer 10 has been delivered to the laser processing apparatus 70, the wafer 10 is placed on the chuck table 71 with the reverse side 10*b* facing upwardly and held under suction on the chuck table 71. An infrared camera, not depicted, included in the laser processing apparatus 70 captures an image of the reverse side 10*b* of the wafer 10. The position of one of the projected dicing lines 14 that extend in a first direction is detected from the captured image, and the rotating mechanism rotates the chuck table 72 to align the detected projected dicing line 14 with the X-axis direction on the basis of the detected position. The information regarding the detected position of the projected dicing line 14 is stored in a controller, not depicted.

On the basis of the information regarding the detected position of the projected dicing line 14 by the infrared camera above, the beam condenser 73 of the laser beam applying unit 72 is positioned at a position where the projected dicing line 14 extending in the first direction starts to be processed. The beam condenser 73 then applies the laser beam LB to the wafer 10 while positioning the focused spot of the laser beam LB in the wafer 10 below the projected dicing line 14. At the same time, the chuck table 71 and hence the wafer 10 are processing-fed in the X-axis direction by the X-axis feed mechanism, forming a modified layer 120 in the wafer 10 along the projected dicing line 14 with the focused spot of the laser beam LB. After the modified layer 120 has been formed in the wafer 10 all along the projected dicing line 14, the wafer 10 is indexing-fed in the Y-axis direction by the Y-axis feed mechanism over a distance between the projected dicing line 14 and a next unprocessed projected dicing line 14 until the next projected dicing line 14 is positioned directly below the beam condenser 73. Then, in the similar manner described above, the beam condenser 73 applies the laser beam LB to the wafer 10 while positioning the focused spot of the laser beam LB in the wafer 10 below the next projected dicing line 14, and the wafer 10 is processing-fed in the X-axis direction, forming a modified layer 120 in the wafer 10 along the next projected dicing line 14. Similarly, the wafer 10 is repeatedly indexing-fed in the Y-axis direction and processing-fed in the X-axis direction while the laser beam LB is being applied to the wafer 10, forming modified layers 120 in the wafer 10 below the respective projected dicing lines 14 along the X-axis direction. Then, the wafer 10 is turned 90 degrees about its central axis to bring unprocessed projected dicing lines 14 extending in a second direction perpendicular to the projected dicing lines 14 along which the modified layers 120 have already been formed in the wafer 10 into alignment with the X-axis direction. Then, the laser beam LB is applied to the wafer 10 while positioning the focused spot in the wafer 10 below one of the unprocessed projected dicing lines 14 extending in the second direction, and the wafer 10 is processing-fed in the X-axis direction, forming a modified layer 120 in the wafer 10 below the projected dicing line 14. The wafer 10 is repeatedly indexing-fed in the Y-axis direction and processing-fed in the X-axis direction while the laser beam LB is being applied to the wafer 10, forming modified layers 120 in the wafer 10 below the respective projected dicing lines 14 along the X-axis direction. In this manner, the modified layers 120 are formed in the wafer 10 along all the projected dicing lines 14 extending in the first and second directions. According to the present embodiment, the laser beam LB is applied in three cycles to the wafer 10 along each projected dicing line 14 while positioning the focused spot at different depths, thereby forming a modified layer 120 including three layers of laser processing marks, as illustrated in a lower section of FIG. 8B.

As described above, after the modified layers 120 have been formed in the wafer 10 along the projected dicing lines 14 through laser processing, external force applying means, not depicted, is used to apply an external force to the wafer 10 in its entirety, thereby dividing the wafer 10 into individual device chips along the projected dicing lines 14 where the modified layers 120 have been formed in the wafer 10 (dividing step). The external force applying means may be the grinding apparatus 60 described above with reference to FIG. 6, for example, that grinds the reverse side 10*b* of the wafer 10 to apply an external force to the wafer 10, or may be a resilient rotating roller, not depicted, that applies an external force to the reverse side 10*b* of the wafer 10, or may be a tape, not depicted, affixed to the wafer 10 for applying an external force to the wafer 10 when the tape is expanded radially outwardly. The laser processing apparatus 70 illustrated in FIG. 7 applies the laser beam LB to the reverse side 10*b* of the wafer 10. However, the present invention is not limited to such details. In the absence of obstacles such as electrodes on the projected dicing lines 14 for obstructing the laser beam LB, the laser beam LB can also be applied to the face side 10*a* of the wafer 10.

After the modified layers 120 have been formed in the wafer 10 along the projected dicing lines 14 by the laser processing apparatus 70 and the wafer 10 has been divided along the projected dicing lines 14 into individual device chips by the external force applying means, the package unit forming step and the delivery step can be carried out as described above with reference to FIG. 4. The embodiment described above with reference to FIGS. 7, 8A, and 8B can offer the same advantages as the preceding embodiment.

The present invention is not limited only to situations where the wafer 10 processed by the present invention is delivered to a distant factory or a situation where the processed wafer 10 is delivered to and stored in a storage location in the factory for a long period of time before a next step is performed on the wafer 10. Even if a next step is not carried out in a distant factory or the wafer 10 is not stored in a storage location for a long period of time prior to a next step, the present invention is also applicable to situations where the devices 12 formed on the wafer 10 are of the kind that is intolerant of even a very small level of contamination and the wafer 10 is delivered along a delivery route that is expected to undergo scattering powdery dust particles or other foreign matter, thereby protecting device chips from powdery dust particles or other foreign matter.

The present invention is not limited to the details of the above described preferred embodiments. The scope of the invention is defined by the appended claims and all changes and modifications as fall within the equivalence of the scope of the claims are therefore to be embraced by the invention.

What is claimed is:

1. A method of handling a wafer having a plurality of devices formed in respective areas demarcated on a face side thereof by a grid of intersecting projected dicing lines, comprising:

a frame unit forming step of forming a frame unit by placing the wafer in a central opening of an annular frame, affixing a dicing tape to a surface of the annular frame, and affixing the wafer to the dicing tape;

a dividing step of processing the wafer along the projected dicing lines to divide the wafer into individual device chips including the respective devices;

a package unit forming step of forming a package unit by affixing a sheet to another surface of the annular frame, wherein said package unit forming step includes:

cutting said sheet to form a groove that separates said sheet into an inner sheet portion and an outer sheet portion;

removing said outer sheet portion of said sheet and leaving said inner sheet portion on the annular frame, such that the dicing tape and the inner sheet portion of said sheet surround the wafer, said inner portion of said sheet being affixed to a face side of said wafer; and a delivery step of delivering the package unit.

2. The method according to claim 1, further comprising:

an inactive gas filling step of filling a space in the package unit with an inactive gas, wherein the inactive gas includes one of nitrogen, helium, argon or carbon dioxide.

3. The method according to claim 2, wherein the inactive gas filling step includes the step of filling the space in the package unit with the inactive gas by carrying out the package unit forming step in an inactive gas environment, wherein the inactive gas includes one of nitrogen, helium, argon or carbon dioxide.

4. The method according to claim 2, wherein the inactive gas filling step includes the step of filling the space in the package unit with liquid nitrogen and expanding the liquid nitrogen in the package unit forming step.

5. The method according to claim 1, further comprising:

a cleaning step of cleaning the wafer before the package unit forming step.

6. The method according to claim 1, wherein the sheet includes a thermal-pressure-bonding sheet, and the thermal-pressure-bonding sheet is affixed to the other surface of the annular frame by heat and pressure in the package unit forming step.

7. The method according to claim 6, wherein the thermal-pressure-bonding sheet includes a polyolefin-based sheet selected from the group consisting of a polyethylene sheet, a polypropylene sheet, and a polystyrene sheet.

8. The method according to claim 7, wherein a temperature to which the thermal-pressure-bonding sheet is heated to affix itself to the other surface of the annular frame is in a range from 120° C. to 140° C. if the thermal-pressure-bonding sheet is the polyethylene sheet, from 160° C. to 180° C. if the thermal-pressure-bonding sheet is the polypropylene sheet, and from 220° C. to 240° C. if the thermal-pressure-bonding sheet is the polystyrene sheet.

9. The method according to claim 1, wherein affixing said inner portion of said sheet to said face side of said wafer includes heating said inner portion of said sheet using a heating roller.

* * * * *